United States Patent
Singhal

(10) Patent No.: US 9,692,416 B1
(45) Date of Patent: Jun. 27, 2017

(54) BUFFERS FOR DRIVING CIRCUITS IN A STAND BY MODE

(71) Applicant: Texas Instruments Incorporated, Dallas, TX (US)

(72) Inventor: Vipul Kumar Singhal, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/075,908

(22) Filed: Mar. 21, 2016

(51) Int. Cl.
   H03K 3/00 (2006.01)
   H03K 19/00 (2006.01)
   H03K 17/12 (2006.01)

(52) U.S. Cl.
   CPC ....... H03K 19/0016 (2013.01); H03K 17/122 (2013.01)

(58) Field of Classification Search
   CPC .................. H03K 17/122; H03K 19/0016
   USPC ......................................... 327/109
   See application file for complete search history.

(56) References Cited

U.S. PATENT DOCUMENTS

| | | | | |
|---|---|---|---|---|
| 6,687,865 B1* | 2/2004 | Dervisoglu | ...... | G01R 31/31705 714/726 |
| 2009/0024888 A1* | 1/2009 | Kurimoto | ........ | G01R 31/31858 714/731 |
| 2012/0032719 A1* | 2/2012 | Priel | ..................... | H03K 3/0375 327/198 |
| 2012/0139600 A1* | 6/2012 | Hwang | ............. | H03K 3/356147 327/203 |
| 2013/0275932 A1* | 10/2013 | Oda | ..................... | G06F 17/5031 716/108 |
| 2013/0278297 A1* | 10/2013 | Mottola | ............... | H03K 17/063 327/109 |
| 2015/0263707 A1* | 9/2015 | Kumar | ................. | H03K 3/3565 327/205 |
| 2016/0011260 A1* | 1/2016 | Dervisoglu | ........ | G01R 31/3177 714/727 |

* cited by examiner

*Primary Examiner* — Ryan Jager
(74) *Attorney, Agent, or Firm* — John R. Pessetto; Charles A. Brill; Frank D. Cimino

(57) ABSTRACT

A buffer that drives components during a standby mode includes a first combination of two standard voltage threshold (SVT) transistors and two high voltage threshold (HVT) transistors that generate a logic 1 signal at a first output. A second combination of two SVT transistors and two HVT transistors generates a logic 0 signal at a second output. A power supply operates the buffer, wherein the power supply generates a voltage less that the threshold voltages of the HVT transistors.

11 Claims, 1 Drawing Sheet

BUFFERS FOR DRIVING CIRCUITS IN A STAND BY MODE

BACKGROUND

There is an ever increasing demand for lowering power consumption in electronic devices such as battery-powered devices. Low power consumption translates to longer battery life or being able to operate with smaller and/or less expensive batteries. Many devices enter into a standby mode when they are not active to reduce their power consumption. In order to minimize the total power consumption of an electronic device, the power consumption in the standby mode needs to be minimized.

SUMMARY

A buffer that drives components during a standby mode includes a first combination of two standard voltage threshold (SVT) transistors and two high voltage threshold (HVT) transistors that generate a logic 1 signal at a first output. A second combination of two SVT transistors and two HVT transistors generates a logic 0 signal at a second output. A power supply operates the buffer, wherein the power supply generates a voltage less that the threshold voltages of the HVT transistors.

DETAILED DESCRIPTION

Figure 1:
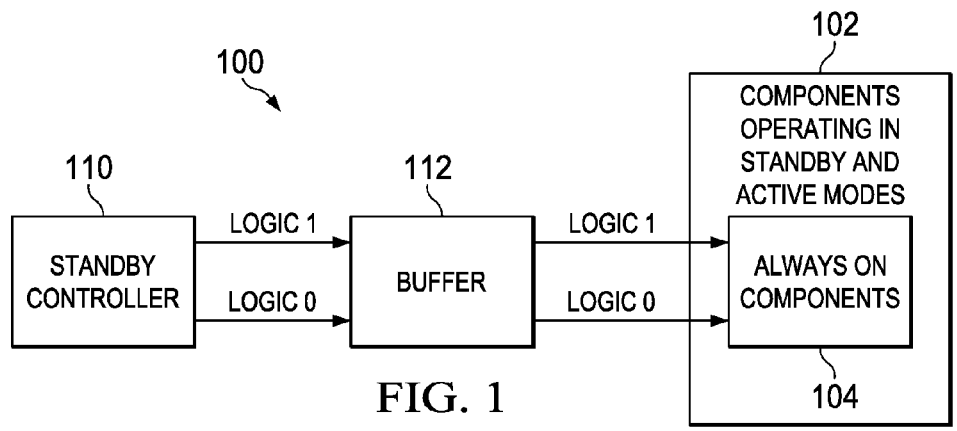
FIG. 1 is a block diagram of an electronic device that has components that operate in an active mode and a standby mode.

Some electronic devices have an active mode and a standby mode. In the active mode, the devices operate normally. For example, in the active mode, the devices may be processing data or performing other operations that they are intended to perform. The devices typically consume a large amount of power when they operate in the active mode. When the devices are not in the active mode, they may enter the standby mode in which their power consumption is reduced. Ideally, the devices do not consume any power in the standby mode, however, they must operate sensors and the like that bring them out of the standby mode and into the active mode. Accordingly, the devices must maintain some components in an active mode while the devices are in the standby mode, which requires some transistors within the components to be on. Current leakage through these transistors or by components driving these transistors is a source of unwanted power consumption when the devices are in the standby mode.

Some circuits, such as digital blocks or modules, are required to fan out certain signals that ensure the blocks remain in an appropriate low-power or standby mode. For example, a power-on signal, which is sometimes referred to in the art as "PON", may be fanned out to all power switches, such as transistors, and driven to a logic low value during the standby mode. The PON signal ensures that all the power switches are off. In another example, an isolation signal, sometimes referred to in the art as "ISO", is fanned out to cells driving the output pins of a powered-down block to ensure that the outputs always drive valid values (logic 1 or logic 0), though the block itself is powered down. It is likely that the exact values that these signals need to drive the blocks in a standby mode are known a-priori. In the examples described above, the PON signal will always drive a logic low and the ISO signal will always drive a logic high during a standby mode. The circuits and methods described herein pertain to such cases where each such fanout signal drives an a-priori known value in the standby mode.

Distributing these signals across a block typically requires a fanout tree of buffers, which are required to remain powered up or active, even when the block is powered down to a standby mode. As such, these buffers consume a certain amount of leakage power, which needs to be minimized to maintain the efficiency of the device. In this context it becomes necessary to examine the type of transistors to be used to construct these buffers.

Another consideration in maximizing efficiency of devices is the power supply voltage. To minimize the power dissipation in the block, the block must be kept at the lowest possible power supply voltage (referred to as "VDD") during the standby mode. However, the lowest value of VDD is determined by the threshold voltage "VT" of the transistors used in the block. If the power supply voltage VDD supplying a digital logic block is less than the threshold voltage of the transistors used in the block, then the transistors that should be switched on will not be turned on fully. Hence, the lowest voltage at which the transistors can be reliably used must be considered in circuit designs. Additionally, the threshold voltages of the transistors must be considered for minimum leakage Transistors typically have one of three threshold voltages, high voltage threshold "HVT", low voltage threshold "LVT", and standard voltage threshold "SVT". The threshold voltages are relative to one another and are not necessarily fixed voltages. High voltage threshold transistors have less current leakage and less power consumption than the other transistors, but they need higher operating voltages to be on. Low voltage threshold transistors have higher current leakage and greater power consumption than HVT transistors. However, LVT transistors can be kept on at lower voltages than HVT transistors. Standard voltage threshold transistors are a trade-off between HVT and LVT transistors because they have moderate power consumption and a minimum operating voltage that lies in between that of the SVT and HVT transistors.

Based on the foregoing, if the above-described fanout buffers are constructed of buffers having HVT transistors, then the fanout buffers will have lower leakage due to the HVT transistors, but will have to be operated at a higher voltage thus losing some of the leakage advantage gained. Conversely, if the fanout buffers are constructed of SVT or LVT transistors, then these buffers can operate at lower voltages, but will have higher power dissipation because the SVT and LVT transistors have higher leakage than the HVT transistors.

The above-described issues with standby modes are overcome as described herein by incorporating multi-threshold complementary metal oxide semiconductors technology (MTCMOS) in electronic devices. MTCMOS is a variation of CMOS chip technology which has transistors with multiple threshold voltages. The circuits described herein typically use metal oxide semiconductor field effect transistors (MOSFETs). The voltage threshold of a MOSFET is the gate voltage at which an inversion layer forms at the interface between the insulating layer and the substrate of the transistor. Low voltage threshold transistors, including MOS- FETs, switch faster than other transistors and are therefore useful in critical timing applications. The penalty of LVT transistors is that they have substantially higher static leakage than HVT transistors, so their power consumption in standby modes is very high. High voltage threshold transistors are used in non-critical applications to reduce static leakage power without causing timing delays.

FIG. 1 is a block diagram of an electronic device 100 that has components 102 that operate in an active mode and a standby mode. The device 100 may be virtually any electronic device, such as a cellular telephone, that operates in an active mode when it is in use and a standby mode when it is not in use. For example, a cellular telephone enters a standby mode when it is not in use. In the standby mode, the screen and other functions of the cellular telephone are inactive. The components 102 need to have always-on components 104 "on-components" 104 that remain active in the standby mode to activate the components 102 from the standby mode to the active mode. Some examples of the on-components 104 include isolation devices for powered-down components, retention signals generated by retaining signals on flip-flop circuits and other circuits, and sensors that detect when the components 102 should come out of the standby mode. The sensors may include monitors or buttons that are triggered by a user to indicate that the device 100 is ready for use and needs to enter the active mode.

The device 100 further includes a standby controller 110 and a buffer 112. The standby controller 110 is an example of a component or circuitry that generates signals to place the components 102 in the standby mode. The standby controller 110 may be a microprocessor or any other device or circuitry and may be within or associated with the on-components 104. In the examples described herein, the standby controller 110 generates a logic 1 and a logic 0 that are used during the standby mode to keep the on-components 104 active during the standby mode. The signals generated by the standby controller 110 are typically very weak and cannot operate all the gates, buffers, and other electronic components associated with the on-components 104.

The logic 1 and logic 0 signals generated by the standby controller 110 are input to the buffer 112. The buffer generates logic 1 and logic 0 signals that are strong enough to operate the on-components 104. The on-components 104 may be located throughout the device 100, so the logic signals generated by the buffer 112 have to be strong enough to drive the on-components 104. The logic signals are fanned out through the on-components 104 using buffer trees or other techniques as described above. The buffer 112 ideally should not have any leakage current because the leakage current will increase power consumption of the device 100 during the standby mode.

The buffer 112 described herein operates at a voltage that is less than the high voltage threshold, but marginally higher than the standard voltage threshold. If the buffer 112 were operated at the high voltage threshold, it likely would not have enough power to drive the logic 1 and logic 0 signals to all the on-components 104. The low current of the high voltage threshold operation also makes the logic 1 and logic 0 signals very sensitive to noise and variability. If the buffer 112 were to be operated in the standard voltage threshold, the leakage during the standby mode will be high.

The on-components 104 have known static values in the standby mode. For example, a flip-flop retention may require a control input driven to static logic 1, and an isolation device may require a control input driven to a static logic 0 applied during the standby mode. Accordingly, the standby controller 110 may generate the logic 1 and logic 0 signals that are disbursed through the on-components 104, wherein the logic 1 and logic 0 signals are static during the standby mode.

Figure 2:
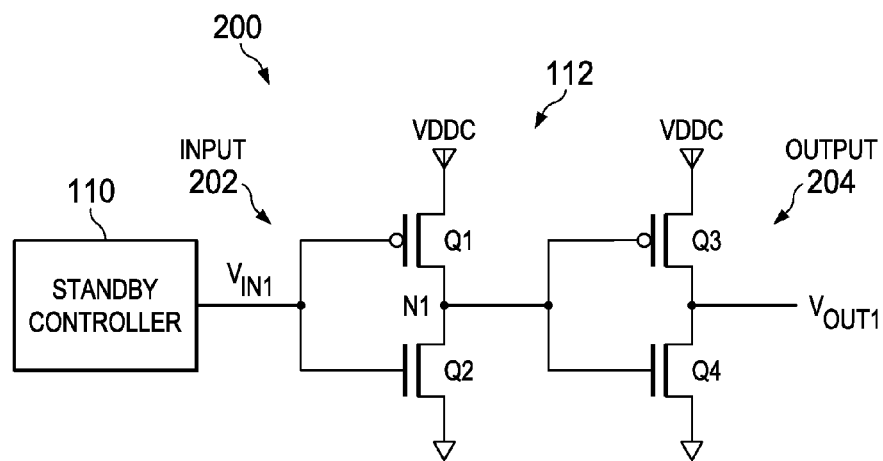
FIG. 2 is a schematic diagram of a buffer for generating a logic 1 signal.
Figure 3:
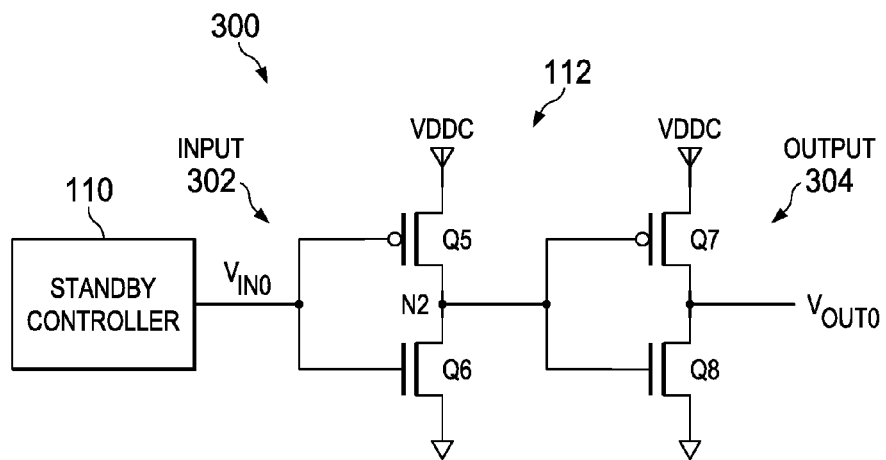
FIG. 3 is a schematic diagram of a buffer for generating a logic 0 signal.

FIG. 2 is a schematic diagram of a circuit 200 for generating a logic 1 within the buffer 112 and FIG. 3 is a schematic diagram of a circuit 300 for generating a logic 0 within the buffer 112. The circuit 200 includes an input 202 that receives a voltage $V_{IN1}$, which is a logic 1 voltage generated by the standby controller 110. The circuit 200 also includes an output 204 that outputs a voltage $V_{OUT1}$, which is the logic 1 signal generated by the buffer 112. The circuit 200 has four transistors Q1-Q4, which may be different transistor types. In the examples described herein, the transistors Q1-Q4 are metal oxide semiconductor field effect transistors (MOSFETs).

The transistor Q1 has the opposite channel type as the transistor Q2. In the example of FIG. 2, the transistor Q1 is a P-channel device and the transistor Q2 is an N-channel device. The gates of the transistors Q1 and Q2 are coupled to the input 202, so the gates have the same voltage potential as the logic 1 signal generated by the standby controller 110 during standby mode. One of either the source or drain of the transistor Q1 is coupled to a power source VDDC and the same of either the source or drain of the transistor Q2 is coupled to ground. So, the sources of the transistors Q1 and Q2 are coupled to VDDC and ground or the drains of the transistors Q1 and Q2 are coupled to VDDC and ground in the example of FIG. 2.

The power source VDDC is sometimes referred to as a power node. The ground is sometimes referred to as a ground node and has a lower voltage potential than the power source VDDC. In the example of FIG. 2, the transistor Q1 is a P-channel device and the transistor Q2 is an N-channel device, so the sources of both the transistors Q1 and Q2 are coupled to the power source VDDC and ground, respectively. The drains of the transistors Q1 and Q2 are both coupled to a node N1, which is sometimes referred to herein as a coupling node. The voltage thresholds of the transistors Q1 and Q2 are different. In the example of FIG. 2, the transistor Q1 has a higher voltage threshold than the transistor Q2, so the transistor Q1 is an HVT transistor and the transistor Q2 an SVT transistor.

The transistor Q3 has the opposite channel type as the transistor Q4. The transistor Q3 has the same channel type as the transistor Q1 and the transistor Q4 has the same channel type as the transistor Q2. In the example of FIG. 2, the transistor Q3 is a P-channel device and the transistor Q4 is an N-channel device. The gates of the transistors Q3 and Q4 are coupled to the node N1. One of either the source or drain of the transistor Q3 is coupled to the power source VDDC and the same of either source or drain of the transistor Q4 is coupled to ground. In the example of FIG. 2, the transistor Q3 is a P-channel transistor and the transistor Q4 is an N-channel transistor, so the sources of both the transistors Q3 and Q4 are coupled to the power source VDDC and ground, respectively. The drains of the transistors Q3 and Q4 are both coupled to the output 204. The voltage thresholds of the transistors Q3 and Q4 are different. In the example of FIG. 2, the transistor Q3 has a lower voltage threshold than the transistor Q4, so the transistor Q3 is an SVT transistor and the transistor Q4 is an HVT transistor. The voltage threshold of transistors Q1 and Q4 may be the same and the voltage thresholds of transistors Q2 and Q3 may be the same.

During standby operation, the standby controller 110 outputs a high voltage (logic 1) to the input 202. When the input voltage $V_{IN1}$ is at a logic 1, transistor Q1 turns off and transistor Q2 turns on. Transistor Q2 is an SVT transistor, so as long as the voltage at the input 202 is higher than the SVT threshold voltage, the transistor Q2 will turn ON fully, ensuring that the voltage at node N1 is low, such as a logic 0. Transistor Q1 is an HVT transistor, and is completely turned off, so that there is very low leakage from this portion of the circuit 200 during standby operation. When the voltage at the node N1 is low or logic 0, transistor Q3 turns on and transistor Q4 turns off. Transistor Q3 is an SVT transistor, so it is able to drive the on-components 104 during standby operation. Transistor Q4 is an HVT transistor, so it reduces leakage on this portion of the circuit 200 during standby operation. Accordingly, the always-on components 104 are driven with enough power or drive strength to maintain their states without excessive leakage from the buffer 112.

FIG. 3 is a schematic diagram of a circuit 300 for generating a logic 0 within the buffer 112. The circuit 300 includes an input 302 that receives a voltage $V_{IN0}$, which is a logic 0 voltage generated by the standby controller 110. The circuit 300 includes an output 304 that outputs a voltage $V_{OUT0}$, which is the logic 0 signal generated by the buffer 112. The circuit 300 has four transistors Q5-Q8, which may be different transistor types. In the examples described herein, the transistors Q5-Q8 are MOSFETs.

The transistor Q5 has the opposite channel type as that of the transistor Q6. In the example of FIG. 3, the transistor Q5 is a P-channel device and the transistor Q6 is an N-channel device. The gates of the transistors Q5 and Q6 are coupled to the input 302, so the gates have the same voltage potential as the signal generated by the standby controller 110. During standby mode, the input 302 has a logic 0 voltage potential. One of either the source or drain of the transistor Q5 is coupled to the power source VDDC and the same of either source or drain of the transistor Q6 is coupled to ground. In the example of FIG. 3, the transistor Q5 is a P-channel transistor and the transistor Q6 is an N-channel transistor, so the sources of both the transistors Q5 and Q6 are coupled to the power source VDDC and ground, respectively. The drains of the transistors Q5 and Q6 are both coupled to a node N2, which is sometimes referred to as a coupling node. The voltage thresholds of the transistors Q5 and Q6 are different. In the example of FIG. 3, the transistor Q5 has a lower voltage threshold than the transistor Q6, so in this embodiment the transistor Q5 the SVT transistor and the transistor Q6 is the HVT transistor.

The transistor Q7 has the opposite channel type as the transistor Q8. The transistor Q7 has the same channel type as the transistor Q5 and the transistor Q8 has the same channel type as the transistor Q6. In the example of FIG. 3, the transistor Q7 is a P-channel transistor and the transistor Q8 is an N-channel transistor. The gates of the transistors Q7 and Q8 are coupled to the node N2. One of either the source or drain of the transistor Q7 is coupled to the power source VDDC and the same of either the source or drain of the transistor Q8 is coupled to ground. In the example of FIG. 3, the transistor Q7 is a P-channel transistor and the transistor Q8 is an N-channel transistor, so the sources of both the transistors Q7 and Q8 are coupled to the power source VDDC and ground, respectively. The drains of the transistors Q7 and Q8 are both coupled to the output 304. The voltage thresholds of the transistors Q7 and Q8 are different. In the example of FIG. 3, the transistor Q7 has a higher voltage threshold than the transistor Q8, so the transistor Q7 is the HVT transistor and the transistor Q8 is the SVT transistor. The transistors Q5 and Q8 may have the same voltage threshold and the transistors Q6 and Q7 may have the same voltage thresholds.

During standby operation, the standby controller 110 outputs a low voltage or logic 0 to the input 302. When the input voltage $V_{IN1}$ is logic 0, transistor Q5 turns on and transistor Q6 turns off. Transistor Q5 is an SVT transistor, so as long as the voltage $V_{IN0}$ at input 302 is higher than the standard threshold voltage, the transistor Q5 will turn on fully, ensuring that the voltage at node N2 is low or logic 0. Because transistor Q6 is an HVT transistor, and is completely turned off, there is very low leakage from this portion of the circuit 300 during standby operation. When the voltage at the node N2 is high, transistor Q8 turns on and transistor Q7 turns off. Transistor Q8 is an SVT transistor, so it is able to drive the always-on components 104 low during standby operation. Transistor Q7 is an HVT transistor, so it reduces leakage on this portion of the circuit 300 during standby operation. Accordingly, the on-components 104 are driven with enough power to maintain their states during standby operation without excessive leakage from the buffer 112.

During active operation of the device 100, the components 102 draw power required for the active operation. Known and static logic values generated by the standby controller 110 cause the device 100 to enter the standby mode. The buffer 112, which includes the circuits 200 and 300, generates the logic signals to operate the on-components 104. The circuits 200 and 300 provide enough drive strength to operate the on-components 104 while having very little leakage current.

In summary, the construction of the buffers described herein enables their usage in standby mode at a supply voltage that is less than the threshold voltages of the HVT transistors. The supply voltage could be a voltage close to the threshold voltage of the SVT transistors. The leakage of the buffer will, however, be the same as the leakage of an entire buffer consisting entirely of HVT transistors, but operating at a voltage lower than the high voltage threshold.

Different techniques are known in the art for fabricating transistors having different threshold voltages. In some embodiments, different forward or reverse body bias voltages are applied to the transistors, which affect their voltage thresholds. Another technique involves changing the gate oxide thickness, gate oxide dielectric constant (material type), or dopant concentration in the channel region beneath the gate oxide during transistor fabrication. Another technique involves adding additional photolithography and ion implantation steps in the channel region beneath the gate oxide. For example, the voltage threshold may be adjusted by altering the concentration of dopant atoms in the channel region beneath the gate oxide.

While some examples of buffers have been described in detail herein, it is to be understood that the inventive concepts may be otherwise variously embodied and employed and that the appended claims are intended to be construed to include such variations except insofar as limited by the prior art.

What is claimed is:

1. A buffer for driving devices at a high voltage level during a standby mode, the buffer comprising:
    an input for receiving a logic 1 voltage;
    a power node connectable to a power source;
    a ground node connectable to a voltage that is lower than the voltage of the power source;

a first high voltage threshold (HVT) transistor coupled between the power node and a coupling node, the first HVT transistor having a gate coupled to the input;

a first standard voltage threshold (SVT) transistor coupled between the coupling node and the ground node, the first SVT transistor having a gate coupled to the input, wherein the channel type of the first SVT transistor is opposite of the channel type of the first HVT transistor;

a second SVT transistor coupled between the power node and an output node, the second SVT transistor having a gate coupled to the coupling node; and a second HVT transistor coupled between the output node and the ground node, the second HVT transistor having a gate coupled to the coupling node, wherein the channel type of the second SVT transistor is opposite of the channel type of the second HVT transistor.

2. The buffer of claim 1, wherein the channel types of the first HVT transistor and the second SVT transistor are p-channel and the channel types of the first SVT transistor and the second HVT transistor are n-channel.

3. The buffer of claim 1, wherein the power node is connectable to a voltage source having a voltage potential between a standard voltage threshold and a high voltage threshold.

4. The buffer of claim 3, wherein the voltage potential is closer to the high voltage threshold than the standard voltage threshold.

5. The buffer of claim 1, wherein the sources of the first HVT transistor the second SVT transistor are coupled to the power node and wherein the sources of the first SVT transistor and the second HVT transistor are coupled to the ground node.

6. A buffer for driving devices at a low voltage level during a standby mode, the buffer comprising:

an input for receiving a logic 0 voltage;

a power node connectable to a power source;

a ground node connectable to a voltage that is lower than the voltage of the power source;

a first standard voltage threshold (SVT) transistor coupled between the power node and a coupling node, the first SVT transistor having a gate coupled to the input;

a first high voltage threshold (HVT) transistor coupled between the coupling node and the ground node, the first HVT transistor having a gate coupled to the input, wherein the channel type of the first SVT transistor is opposite of the channel type of the first HVT transistor;

a second HVT transistor coupled between the power node and an output node, the second HVT transistor having a gate coupled to the coupling node; and a second SVT transistor coupled between the output node and the ground node, the second SVT transistor having a gate coupled to the coupling node, wherein the channel type of the second SVT transistor is opposite of the channel type of the second HVT transistor.

7. The buffer of claim 6, wherein the channel types of the first HVT transistor and the second SVT transistor are N-channel and the channel types of the first SVT transistor and the second HVT transistor are P-channel.

8. The buffer of claim 6, wherein the power node is connectable to a voltage source having a voltage potential between a standard voltage threshold and a high voltage threshold.

9. The buffer of claim 8, wherein the voltage potential is closer to the high voltage threshold than the standard voltage threshold.

10. The buffer of claim 6, wherein the sources of the first SVT transistor and the second HVT transistor are coupled to the power node and wherein the sources of the first HVT transistor and the second SVT transistor are coupled to the ground node.

11. The buffer of claim 6, wherein the transistors are metal oxide semiconductor field-effect transistors.

* * * * *